United States Patent
Shen et al.

(10) Patent No.: US 10,329,667 B2
(45) Date of Patent: Jun. 25, 2019

(54) DEPOSITION METHOD

(71) Applicants: Semiconductor Manufacturing International (Shanghai) Corporation, Shanghai (CN); Semiconductor Manufacturing International (Beijing) Corporation, Beijing (CN)

(72) Inventors: Jian Fei Shen, Shanghai (CN); Yang Wang, Shanghai (CN)

(73) Assignees: SEMICONDUCTOR MANUFACTURING INTERNATIONAL (SHANGHAI) CORPORATION (CN); SEMICONDUCTOR MANUFACTURING INTERATIONAL (BEIJING) CORPORATION (CN)

( * ) Notice: Subject to any disclaimer, the term of this patent is extended or adjusted under 35 U.S.C. 154(b) by 0 days.

(21) Appl. No.: 15/863,700

(22) Filed: Jan. 5, 2018

(65) Prior Publication Data
US 2018/0195171 A1   Jul. 12, 2018

(30) Foreign Application Priority Data

Jan. 12, 2017 (CN) .......................... 2017 1 0019473

(51) Int. Cl.
| C23C 16/44 | (2006.01) |
| C23C 16/52 | (2006.01) |
| C23C 16/46 | (2006.01) |
| C23C 14/54 | (2006.01) |
| C23C 18/16 | (2006.01) |

(52) U.S. Cl.
CPC ........ C23C 16/4411 (2013.01); C23C 14/541 (2013.01); C23C 16/44 (2013.01); C23C 16/463 (2013.01); C23C 16/52 (2013.01); C23C 18/1691 (2013.01)

(58) Field of Classification Search
CPC ....... C23C 16/00–16/56; C23C 14/541; C23C 16/4411; C23C 16/463; C23C 18/1691
See application file for complete search history.

(56) References Cited

U.S. PATENT DOCUMENTS 9,018,106 B1 * 4/2015 Koehler ............ H01L 21/76224
                                                              438/778

* cited by examiner

*Primary Examiner* — Selim U Ahmed
*Assistant Examiner* — Evan G Clinton
(74) *Attorney, Agent, or Firm* — Innovation Counsel LLP

(57) ABSTRACT

A deposition method relating to semiconductor technology is presented. The deposition method includes: conducting a first deposition in a reaction chamber at a first deposition temperature; conducting a cool-down process on the reaction chamber, and conducting a second deposition during the cool-down process. In the first deposition, the thin-films deposited on the periphery of a wafer are thicker than those deposited on the center of a wafer, while in the second deposition, the thin-films deposited on the periphery of a wafer are thinner that those deposited on the center of a wafer. Therefore the thin-films deposited by this deposition method are more homogeneous in thickness that those deposited with conventional methods.

9 Claims, 3 Drawing Sheets

DEPOSITION METHOD

CROSS-REFERENCE TO RELATED APPLICATION

This application claims priority to and benefit of Chinese Patent Application No. 201710019473.X filed on Jan. 12, 2017, which is incorporated herein by reference in its entirety.

BACKGROUND

(a) Field of the Invention

This inventive concept relates to semiconductor technology, more specifically, a deposition method.

(b) Description of the Related Art

In semiconductor manufacturing processes, particularly in Low Pressure Chemical Vapor Deposition (LPCVD) of a thin-film deposition process, it is a challenge to deposit homogeneously on a wafer. Conventional methods for furnace film deposition comprise first raising a quartz boat loaded with wafers to a reaction chamber, then maintaining the temperature in the reaction chamber for a certain amount of time, and then conducting a constant-temperature deposition in the reaction chamber. After the deposition, the exhaust gas is released, the reaction chamber is cooled down, and the quartz boat is lowered. The thin-films deposited in conventional methods, however, have a large discrepancy on their thicknesses, with the thin-films deposited on the periphery of a wafer typically thicker than those deposited on the center of a wafer.

In conventional methods, the thickness of the deposition are adjusted as a whole by adjusting the pressure and the flow rate in the deposition process. These adjustments, however, do not effectively solve the problem that the thin-films deposited on the periphery of a wafer are thicker than those deposited on the center of a wafer.

SUMMARY

The inventive concept disclosed herein is based on the discovery that, due to heat radiation from heated reaction chamber, in a constant-temperature deposition, the temperature near a wall of the reaction chamber is higher than that at the center of the reaction chamber. As a result, the temperature on wafer periphery is higher than the temperature in wafer center. Since a higher temperature typically results in a thicker deposition, the thin-films deposited on wafer periphery are thicker than those deposited on wafer center.

The inventive concept proposes an innovative solution to remedy this issue.

This inventive concept presents a deposition method that includes:

conducting a first deposition in a reaction chamber at a first deposition temperature;

conducting a cool-down process on the reaction chamber, and conducting a second deposition during the cool-down process.

Additionally, in the aforementioned method, conducting a cool-down process on the reaction chamber may include:

naturally cooling down the reaction chamber by ceasing heating of the reaction chamber.

Additionally, in the aforementioned method, the first deposition may be conducted for a period of a first time, and the second deposition may be conducted for a period of a second time, and the aforementioned method may further comprise:

determining the first time and the second time before the first deposition based on deposition rates at the first temperature and during the cool-down process, and a desired deposition thickness.

Additionally, in the aforementioned method, the pressure, the composition, and the flow rate of a reaction gas used in the first deposition may be the same as those used in the second deposition.

Additionally, in the aforementioned method, in the cool-down process on the reaction chamber, a temperature-vs-time curve depicting a temperature-changing process in the reaction chamber may be a straight line, a stair-step line, or a parabola curve.

Additionally, in the aforementioned method, conducting a cool-down process on the reaction chamber, and conducting a second deposition during the cool-down process may comprise:

cooling down the reaction chamber until the temperature in the reaction chamber is lowered to a second deposition temperature, maintaining the temperature in the reaction chamber at the second deposition temperature for a pre-determined time, and conducting the second deposition at the same time that the temperature is being lowered to the second deposition temperature and also while the temperature is maintained at the second deposition temperature.

Additionally, in the aforementioned method, conducting a cool-down process on the reaction chamber, and conducting a second deposition during the cool-down process may further comprise:

after maintaining the temperature in the reaction chamber at the second deposition temperature for the pre-determined time, further lowering the temperature in the reaction chamber to a third deposition temperature; and conducting the second deposition at that same time that the temperature is being lowered to the third deposition temperature.

Additionally, the aforementioned method may further comprise:

before conducting the first deposition, raising a quartz boat loaded with wafers to the reaction chamber;

heating the reaction chamber to raise the temperature in the reaction chamber to the first deposition temperature;

injecting nitrogen gas or inert gas into the reaction chamber to keep the temperature in the reaction chamber substantially constant; and after the temperature in the reaction chamber is kept substantially constant for a pre-determined time, cease injection of nitrogen gas or inert gas, and inject a reaction gas into the reaction chamber.

Additionally, in the aforementioned method, a criterion to determine whether the temperature in the reaction chamber is substantially constant may be: the temperature in the reaction chamber is in a temperature range of within ±0.5° C. of the first deposition temperature.

Additionally, the aforementioned method may further include:

after conducting the second deposition, lowering the temperature in the reaction chamber to an exhaustion temperature, and releasing the remaining gas in the reaction chamber at the exhaustion temperature;

conducting a natural cooling process on the reaction chamber; and lowering the quartz boat from the reaction chamber.

BRIEF DESCRIPTION OF THE DRAWINGS

The drawings illustrate some embodiments of this inventive concept and will be used to describe this inventive concept along with the specification.

DETAILED DESCRIPTION OF THE EMBODIMENTS

Figure 1:
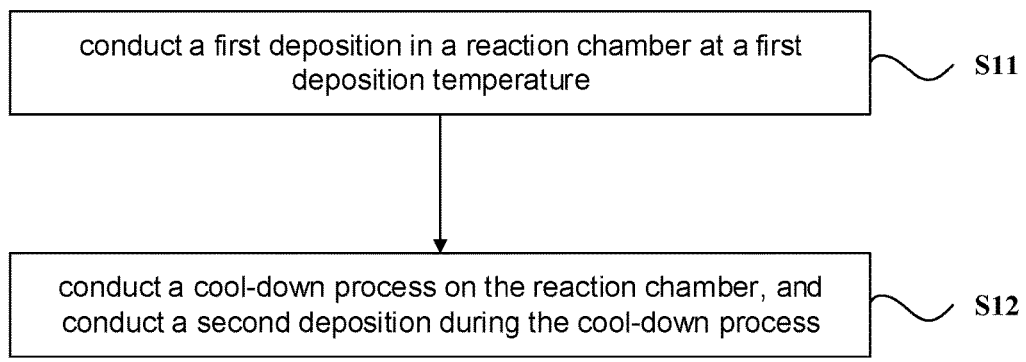
FIG. 1 shows a flowchart illustrating a deposition method in accordance with one or more embodiments of this inventive concept.

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in detail, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms "first," "second," etc. may be used herein to describe various elements, these elements shall not be limited by these terms. These terms may be used to distinguish one element from another element. Thus, a first element discussed below may be termed a second element without departing from the teachings of the present inventive concept. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

The inventive concept disclosed herein is based on the discovery that, due to heat radiation from heated reaction chamber, in a constant-temperature deposition, the temperature near a wall of the reaction chamber is higher than that at the center of the reaction chamber. As a result, the temperature on wafer periphery is higher than the temperature on wafer center. Since a higher temperature typically results in a thicker deposition, the thin-films deposited on wafer periphery are thicker than those deposited on wafer center.

FIG. 1 shows a flowchart illustrating a deposition method in accordance with one or more embodiments of this inventive concept.

In step S11, a first deposition (a constant-temperature deposition) is conducted in a reaction chamber for deposition at a first deposition temperature.

In step S12, a cool-down process is conducted on the reaction chamber to lower the temperature in the reaction chamber, and a second deposition (a low-temperature deposition) is conducted during the cool-down process. For example, the cool-down process comprises: cease heating the reaction chamber to naturally cool down the reaction chamber. In some embodiments, the second deposition may be conducted throughout the entire cool-down process, the second deposition may also be conducted only in one or several periods within the cool-down process though.

In the embodiments described above, the first deposition (the constant-temperature deposition) is first conducted at the first deposition temperature, then the second deposition (the low-temperature deposition) is conducted. During the second deposition (the low-temperature deposition), the reaction chamber is not heated, therefore, due to heat absorption and dissipation of the wafers in the reaction chamber, the temperature in the periphery of the wafer is lower than the temperature in the center of the wafer. As a result, in the low-temperature deposition, the thin-films deposited on wafer center are thicker than those deposited on wafer periphery. Since in the constant-temperature deposition, the thin-films deposited on wafer periphery are thicker than those deposited on wafer center, the combination of these two types of thin-films makes the overall thickness of the deposited thin-films more uniform.

In one embodiment, the first deposition is conducted for a period of a first time, and the second deposition is conducted for a period of a second time. For example, the deposition method may further comprise: before the first deposition, determining the first time and the second time based on deposition rates at the first deposition temperature and during the cool-down process, and a desired deposition thickness. The deposition rates at the first deposition temperature and during the cool-down process may be obtained empirically. By selecting a proper first time for the first deposition and a proper second time for the second deposition, the thickness homogeneous of the deposited thin-films may be further fine-tuned.

In one embodiment, the pressure, the composition, and the flow rate of a reaction gas used in the first deposition are the same as those used in the second deposition. That is, in the entire deposition, only the cool-down process need to be adjusted to obtain a homogeneous thickness of the deposited thin-films, and no other deposition condition need to be changed.

In one embodiment, during the cool-down process of the reaction chamber, a temperature-vs-time cure depicting a temperature-changing process in the reaction chamber may be a straight line, a stair-step line, or a parabola curve. The temperature-vs-time curve can be other curve as well, and this inventive concept is not limited herein.

Figure 2:
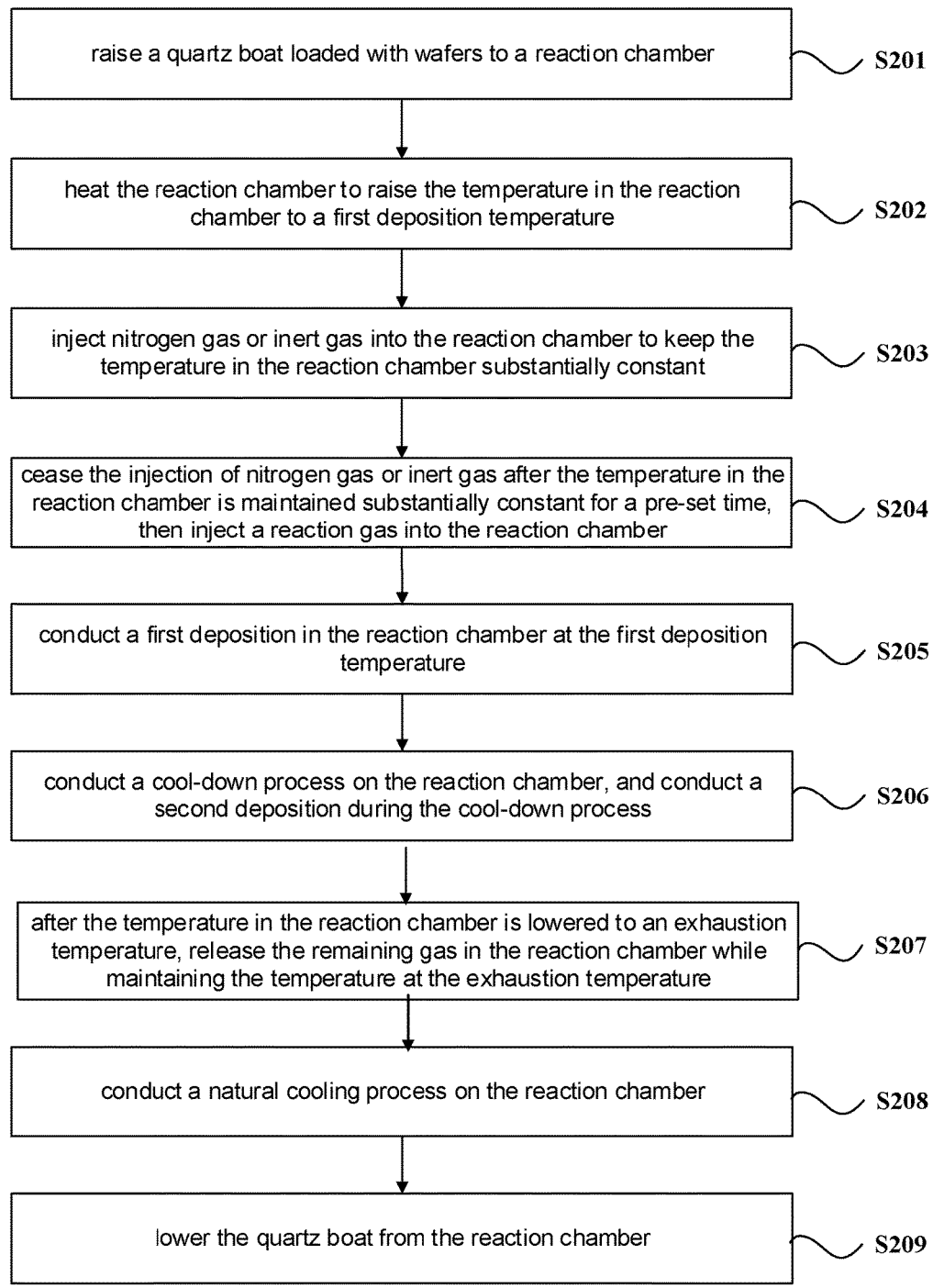
FIG. 2 shows a flowchart illustrating another deposition method in accordance with one or more embodiments of this inventive concept.
Figure 3:
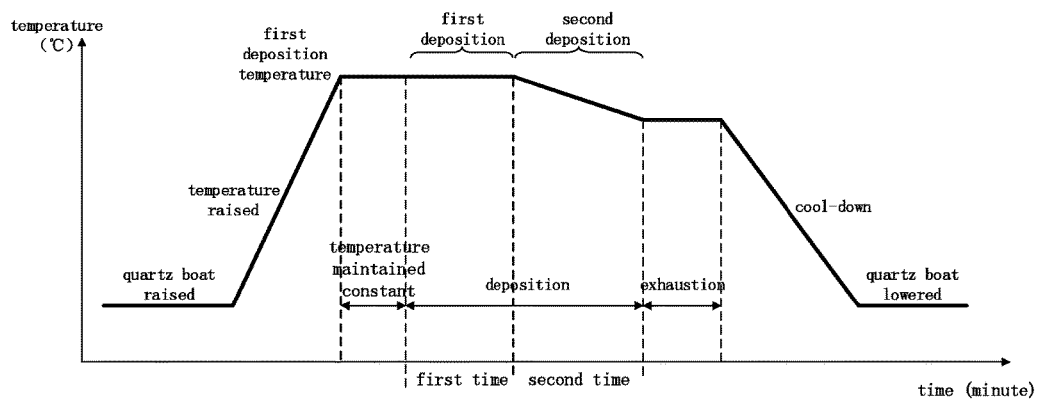
FIG. 3 shows a temperature-vs-time curve depicting a deposition method in accordance with one or more embodiments of this inventive concept.

FIG. 2 shows a flowchart illustrating another deposition method in accordance with one or more embodiments of this inventive concept. FIG. 3 shows a temperature-vs-time curve depicting a deposition method in accordance with one or more embodiments of this inventive concept. This deposition method will be described below with reference to FIGS. 2 and 3.

Referring to FIG. 2, in step S201, a quartz boat loaded with wafers is raised to the reaction chamber. Referring to FIG. 3, during the process the quartz boat being raised, the temperature in the reaction chamber is maintained at a constant (e.g., 500° C.).

Referring to FIG. 2, in step S202, the reaction chamber is heated to raise the temperature in the reaction chamber to a first deposition temperature. Referring to FIG. 3, during this process, the temperature in the reaction chamber may be raised at a pre-determined rate (e.g., 5° C./minute) until the first deposition temperature is reached. The first deposition temperature may be any temperature (e.g., 680° C.) in a temperature range where a reaction gas will break down.

Referring to FIG. 2, in step S203, nitrogen gas or inert gas is injected into the reaction chamber to keep the temperature in the reaction chamber substantially constant. Referring to FIG. 3, in this process, the temperature in the reaction chamber, which is the first deposition temperature, is maintained for a pre-determined time to ensure the stability of the first deposition temperature for the first deposition.

Optimally, a criterion to determine the temperature in the reaction chamber is substantially constant is the temperature in the reaction chamber is in a temperature range of within ±0.5° C. of the first deposition temperature. It should be understood that this criterion is an example and other temperature ranges may be used for that criterion. For example, the temperature range may be within ±1° C. of the first deposition temperature, and this inventive concept is not limited herein.

Referring to FIG. 2, in step S204, after the temperature in the reaction chamber is maintained substantially constant for a pre-determined time, the injection of nitrogen gas or inert gas is ceased, and a reaction gas is injected into the reaction chamber to prepare for the first deposition.

Next, in step S205, a first deposition is conducted in the reaction chamber at the first deposition temperature. Referring to FIG. 3, the duration of the first deposition (the constant-temperature deposition) is a first time. For example, the first time may be in a range of from 5 minutes to 120 minutes (e.g., 10 minutes). In the first deposition, as a result of heat radiation from the reaction chamber, the thin-films deposited on wafer periphery are thicker than those deposited on wafer center.

Referring to FIG. 2, in step S206, a cool-down process is conducted on the reaction chamber, and a second deposition (a low-temperature deposition) is conducted during the cool-down process. Referring to FIG. 3, the duration of the second deposition is a second time. For example, the second time may be in a range of from 5 minutes to 120 minutes (e.g., 10 minutes). During the cool-down process, the reaction chamber is not heated, due to heat absorption and dissipation of the wafers in the reaction chamber, the temperature in the periphery of the wafer is lower than that in the center of the wafer, therefore in the second deposition, the thin-films deposited on wafer center are thicker than those deposited on wafer periphery.

In one embodiment, the temperatures in the reaction chamber during the first deposition and the second deposition are both in a range where the reaction gas will break down, this ensures that the thin-films can be formed by reacting with the reaction gas.

Referring to FIG. 2, in step S207, after the temperature in the reaction chamber is lowered to an exhaustion temperature, the remaining gas in the reaction chamber after the deposition is released while the temperature being maintained at the exhaustion temperature. For example, the exhaustion temperature may be a temperature under which the reaction gas will not break down (e.g., 660° C.). Referring to FIG. 3, during the process the remaining gas is released, the exhaustion temperature is maintained substantially constant. In one embodiment, the remaining gas may comprise reaction gas that has not been used for deposition or a new gas as a result of the deposition.

Referring to FIG. 2, in step S208, a natural cooling process is conducted on the reaction chamber. Referring to FIG. 3, during the natural cooling process, the reaction chamber is not heated and the temperature in the reaction chamber is naturally cooled down until the temperature is suitable to lower the quartz boat (e.g., 500° C.).

Referring to FIG. 2, in step S209, the quartz boat is lowered from the reaction chamber. The quartz boat is lowered so that the deposited thin-films samples may be transported or taken out. Referring to FIG. 3, the temperature under which the quartz boat is lowered may be the same as or similar to the temperature under which the quartz boat is raised.

This concludes the description of a deposition method in accordance with one or more embodiments of this inventive concept. The thin-films deposited with this deposition method are more homogeneous in thickness than those deposited with conventional methods.

The inventors of this inventive concept make a comparison on the thickness homogeneous between the thin-films deposited with the deposition method of this inventive concept and those deposited with conventional methods. Within the thin-films deposited with conventional methods, those deposited by the constant-temperature deposition have a thickness homogeneous of U %>3. Here, the thickness homogeneous (U %) of a thin-film is calculated by the following steps: first, select a plurality of sample points on the wafer where the thin-films are deposited; second, measure the deposition thickness on each sample point; and third, compute the thickness homogeneous (U %) using:

$$U\% = \frac{H_{max} - H_{min}}{H_{ave} \times 2} \times 100\%$$

where $H_{max}$ is the maximum thickness among all the sample points, $H_{min}$ is the minimum thickness among all the sample points, and $H_{ave}$ is the average thickness of all the sample points. For the thin-films deposited by the deposition method of this inventive concept, that is, deposited by a combination of the first deposition (the constant-temperature deposition) and the second deposition (the low-temperature deposition), their thickness homogeneous is U %<2. This demonstrates that the deposition method of this inventive concept improves the thickness homogeneous of the deposited thin-films by at least 50% over conventional methods.

It should be understood that, although FIG. 3 only shows two depositions, which are the first deposition (the constant-temperature deposition) and the second deposition (the low-temperature deposition), a person of ordinary skill in the art in this field would understand that the deposition method of this inventive concept may comprise more depositions. For example, the constant-temperature deposition and the low-temperature deposition can be conducted alternately and repeated multiple times. In that case, the temperature-vs-time curve is a stair-step curve. In another example, the temperature-vs-time curve in the low-temperature deposition may also be a parabola. Therefore this inventive concept is not limited by the curve shown in FIG. 3.

Figure 4:
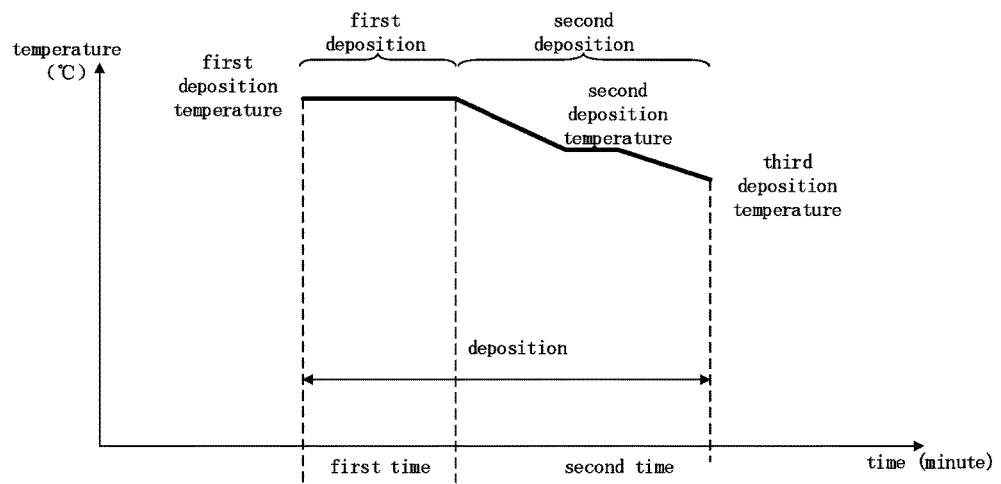
FIG. 4 shows a temperature-vs-time curve depicting another deposition method in accordance with one or more embodiments of this inventive concept.

FIG. 4 shows a temperature-vs-time curve depicting another deposition method in accordance with one or more embodiments of this inventive concept. It should be understood that, although FIG. 4 only shows the temperature change during the first deposition and the second deposition, a person of ordinary skill in the art in this field would understand that the curve in FIG. 4 can also show the temperature change in other processes. For example, FIG. 4 can also show the temperature change in the processes the quartz boat being raised, the temperature being raised, the temperature being maintained, the remaining gas being released, the temperature being lowered, and the quartz boat being lowered, as those shown in FIG. 3.

As shown in FIG. 4, the temperature for the first deposition is maintained substantially constant, that is similar to that shown in FIG. 3 and is not repeatedly described here. FIG. 4 also shows the temperature change during the second deposition, that is, the process the reaction chamber is cooled down and the second deposition is conducted while the reaction chamber is cooling down.

Referring to FIG. 4, in one embodiment, the process the reaction chamber is cooled down and the second deposition is conducted while the reaction chamber being cooled down comprises: cooling down the reaction chamber until the temperature in the reaction chamber is lowered to a second deposition temperature, maintaining the temperature in the reaction chamber at the second deposition temperature for a pre-determined time; and conducting the second deposition in the process the temperature being lowered to the second deposition temperature and in the process the temperature being maintained at the second deposition temperature.

Referring to FIG. 4, in one embodiment, the process the reaction chamber is cooled down and the second deposition is conducted while the reaction chamber being cooled down further comprises: after maintaining the temperature in the reaction chamber at the second deposition temperature for the pre-determined time, continue lowering the temperature in the reaction chamber to a third deposition temperature; and conducting the second deposition in the process the temperature being lowered to the third deposition temperature. The third deposition temperature is higher than or equal to the temperature at which the remaining gas in the reaction chamber is released (the exhaustion temperature).

In the cool-down process shown in FIG. 4, the temperature in the reaction chamber is not continuously lowered. Instead, the temperature goes through a platform phase where the temperature is maintained substantially constant (at the second deposition temperature) for a period of time. This is beneficial to control the deposition and to improve the homogeneous of the deposited thin-films.

It should be understood that, although FIG. 4 only shows one platform phase during the second deposition, a person of ordinary skill in the art in this field would understand that the temperature in the reaction chamber may go through multiple platform phases during the cool-down process so that the deposition process can be better controlled. Thus the number of platform phases (and the number of deposition temperatures) is not limited herein.

The deposition method of this inventive concept not only can be conducted in a furnace, it can also be conducted in other devices suitable for deposition. For example, this deposition method can be conducted in a reaction chamber for Plasma Enhanced Chemical Vapor Deposition (PECVD) or Metal-Organic Chemical Vapor Deposition (MOCVD). Therefore this inventive concept is not limited herein.

Additionally, the films that can be formed by the deposition method of this inventive concept include, but not limit to, semiconductor films (e.g., poly-silicon film, amorphous silicon film, or gallium arsenide film), oxide film (e.g., silicon oxide film), nitride film (e.g., silicon nitride film), and metal film.

This concludes the description of a deposition method in accordance with one or more embodiments of this inventive concept. For the purpose of conciseness and convenience, some components or procedures that are well known to one of ordinary skill in the art in this field are omitted. These omissions, however, do not prevent one of ordinary skill in the art in this field to make and use the inventive concept herein disclosed.

While this inventive concept has been described in terms of several embodiments, there are alterations, permutations, and equivalents, which fall within the scope of this disclosure. It shall also be noted that there are alternative ways of implementing the methods and/or apparatuses of the inventive concept. Furthermore, embodiments may find utility in other applications. It is therefore intended that the claims be interpreted as including all such alterations, permutations, and equivalents. The abstract section is provided herein for convenience and, due to word count limitation, is accordingly written for reading convenience and shall not be employed to limit the scope of the claims.

What is claimed is:

1. A deposition method, comprising:
    conducting a first deposition in a reaction chamber at a first deposition temperature;
    conducting a cool-down process on the reaction chamber, and a second deposition during the cool-down process, comprising:
        cooling down the reaction chamber until the temperature in the reaction chamber is lowered to a second deposition temperature;
        maintaining the temperature in the reaction chamber at the second deposition temperature for a pre-determined time; and
        conducting the second deposition at the same time that the temperature is being lowered to the second deposition temperature and also while the temperature is maintained at the second deposition temperature.

2. The method of claim 1, wherein conducting a cool-down process on the reaction chamber comprises:
    naturally cooling down the reaction chamber by ceasing heating of the reaction chamber.

3. The method of claim 1, wherein the first deposition is conducted for a period of a first time, and the second deposition is conducted for a period of a second time,
    and wherein the method further comprises:
    determining the first time and the second time before the first deposition based on deposition rates at the first temperature and during the cool-down process, and a desired deposition thickness.

4. The method of claim 1, wherein the pressure, the composition, and the flow rate of a reaction gas used in the first deposition are the same as those used in the second deposition.

5. The method of claim 1, wherein in the cool-down process on the reaction chamber, a temperature-vs-time curve depicting a temperature-changing process in the reaction chamber is a straight line, a stair-step line, or a parabola curve.

6. The method of claim 1, wherein conducting a cool-down process on the reaction chamber, and a second deposition during the cool-down process further comprises:
    after maintaining the temperature in the reaction chamber at the second deposition temperature for the pre-determined time, further lowering the temperature in the reaction chamber to a third deposition temperature; and
    conducting the second deposition at the same time that the temperature is being lowered to the third deposition temperature.

7. The method of claim 1, further comprising:
    before conducting the first deposition, raising a quartz boat loaded with wafers to the reaction chamber;
    heating the reaction chamber to raise the temperature in the reaction chamber to the first deposition temperature;
    injecting nitrogen gas or inert gas into the reaction chamber to keep the temperature in the reaction chamber substantially constant; and
    after the temperature in the reaction chamber is kept substantially constant for a pre-determined time, cease the injection of nitrogen gas or inert gas, and inject a reaction gas into the reaction chamber.

8. The method of claim 7, wherein a criterion to determine whether the temperature in the reaction chamber is substantially constant is: the temperature in the reaction chamber is in a temperature range of within ±0.5° C. of the first deposition temperature.

9. The method of claim 7, further comprising:
    after conducting the second deposition, lowering the temperature in the reaction chamber to an exhaustion temperature, and releasing the remaining gas in the reaction chamber at the exhaustion temperature;
    conducting a natural cooling process on the reaction chamber; and
    lowering the quartz boat from the reaction chamber.

* * * * *